United States Patent [19]

Mast

[11] Patent Number: 4,916,578

[45] Date of Patent: Apr. 10, 1990

[54] PERSONAL COMPUTER CHASSIS CONNECTION AND METHOD

[75] Inventor: Thomas R. Mast, Austin, Tex.

[73] Assignee: Compuadd Corporation, Austin, Tex.

[21] Appl. No.: 270,268

[22] Filed: Nov. 14, 1988

[51] Int. Cl.⁴ .............................................. H05K 9/00
[52] U.S. Cl. .................................................. 361/424
[58] Field of Search ........ 361/424; 174/35 R, 35 GC, 174/35 C

[56] References Cited

U.S. PATENT DOCUMENTS 2,844,644 7/1958 Soule, Jr. ...................... 174/35 GC
3,885,084 5/1975 Kaiserswerth et al. ........ 174/35 GC

*Primary Examiner*—Roy N. Envall, Jr.
*Attorney, Agent, or Firm*—Baker, Mills & Glast

[57] ABSTRACT

L-shaped flanges (20) are formed integrally with both edges of the base (12) on a computer chassis (10). U-shaped channels (26) are also formed integrally with both edges (21-22) of the cover (14) on the computer chassis (10). The cover (14) is installed over the base (12) by matching the U-shaped channels (26) with the L-shaped flanges (20) and sliding the cover (14) into position. The metal-to-metal contact all along the U-shaped channels (26) and the L-shaped flanges (20) helps retard the emission of radio frequency from the chassis (10).

16 Claims, 1 Drawing Sheet

U.S. Patent    Apr. 10, 1990    4,916,578
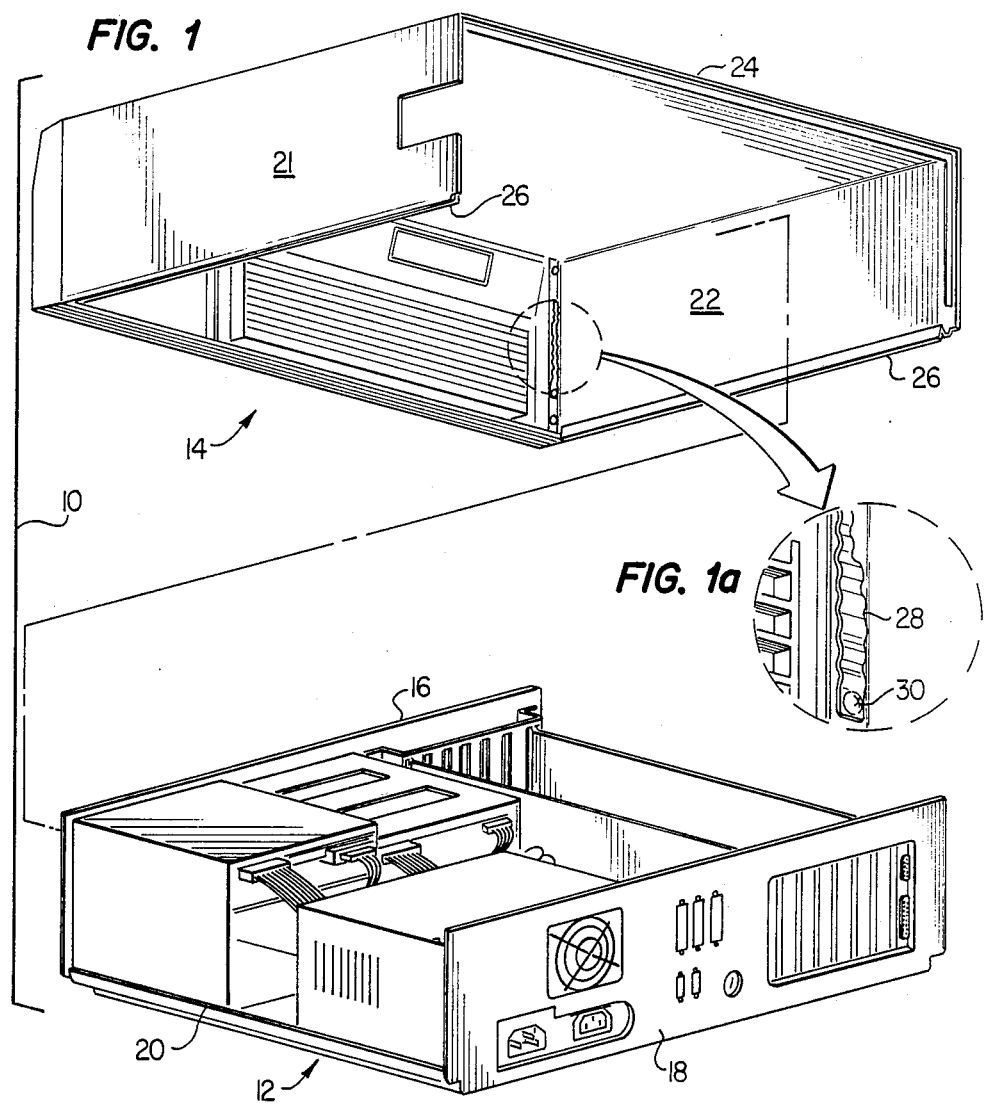
FIG. 1
FIG. 1a
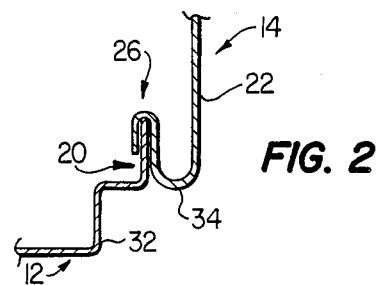
FIG. 2

PERSONAL COMPUTER CHASSIS CONNECTION AND METHOD

TECHNICAL FIELD OF THE INVENTION

This invention relates in general to computers, and in particular to an improved personal computer chassis connection and method.

BACKGROUND OF THE INVENTION

A personal computer central processing unit (CPU) is an assemblage of electronic and solid state semiconductors in an arrangement of components and subcomponents. The functioning of the electronic components within the CPU generates high frequencies which result in the emission of radio frequency (RF) electromagnetic radiation therefrom. In response, the Federal Communications Commission (FCC) has created standards which limit the amount of allowable radio frequency to be emitted from electronic devices. It has been found that any openings in the enclosure surrounding the electronic components of the CPU (or any other electronic device) allow the escape of radio frequency. Therefore, in order to reduce RF emission and to meet FCC guidelines, it is necessary to close and seal any openings as best as practicable.

One source of escaping electromagnetic radiation is the connection between the base and the cover of the CPU chassis. The cover may be connected to the base by any of several commonly known methods. One such method is to drill holes through the cover and secure the cover to the base with screws. Unfortunately, the use of screws is both cumbersome and an exasperation of the problem. Unless the screws are properly installed, leakage may occur around the screws. Moreover, the screws may loosen or corrode, thus exposing apertures which may allow RF leakage.

Another previously developed method is to fix a bracket to either the cover or the base. A mating portion is then fixed to the opposite piece and the connection is made. The use of a bracket is generally an effective connection but is an addition to the cost and manufacturing time due to the required addition of the bracket. Thus there is a need for an effective connection that is easy to manufacture, does not add excessively to the cost of the chassis and retards the escape of RF.

SUMMARY OF THE INVENTION

The present invention disclosed herein comprises a method and apparatus for improving the connection between a base and a cover of a personal computer central processing unit which substantially eliminates or reduces problems associated with the emission of radio frequency. The present invention allows the cover to be slidably connected to the base to retard the escape of radio frequency.

In accordance with one aspect of the present invention, an improved connection between a base and a cover for a personal computer retards the transmission of radio frequency. A plurality of L-shaped flanges and a plurality of mating U-shaped channels are fixed to the base and the cover. The L-shaped flanges are slidably received by the U-shaped channels to connect the cover to the base and retard the escape of radio frequency.

In a further aspect of the present invention, the L-shaped flanges are formed integrally with the base, and the U-shaped channels are formed integrally with the cover. To install the cover onto the base, the U-shaped channels are aligned with the L-shaped flanges, and the cover is slid into position over the base. Contact between the L-shaped flange and tee U-shaped channel provides an effective barrier to the escape of radio frequency.

It is a technical advantage of the present invention that the U-shaped channels and the L-shaped flanges are formed integrally with the cover and the base, respectively. Thus, it is less expensive and easier to manufacture the connection without the necessity of adding additional parts and is an effective barrier to the escape of radio frequency.

BRIEF DESCRIPTION OF THE DRAWINGS

For a more complete understanding of the present invention and for further advantages thereof, reference is now made to the following Detailed Description, taken in conjunction with the accompanying Drawings, in which:

FIG. 1 is an exploded perspective view of a computer chassis constructed in accordance with the preferred embodiment of the present invention;

FIG. 1a is a detailed view of a contact clip used in conjunction with the present invention; and FIG. 2 is a cross-sectional view of the channel and flange connection constructed in accordance with the present invention.

DETAILED DESCRIPTION OF THE INVENTION

In FIGS. 1–2, like items are identified by like and corresponding numerals for ease of reference. Referring to FIG. 1, a central processing unit (CPU) chassis constructed in accordance with the preferred embodiment of the present invention is generally identified by the reference numeral 10. The chassis 10 comprises a base 12 and a cover 14. The base 12 has a front panel 16 and a rear panel 18 with a plurality of electronic components positioned therebeween that provide the functions of the CPU. Formed integrally with the base 12 and perpendicular to front panel 16 and rear panel 18 are L-shaped flanges 20 (only one of which is shown).

The cover 14 comprises a relatively thin metallic structure for enclosing the electronic components arranged on the base 12. The cover 14 has a first edge 21 and a second edge 22 formed perpendicular to a top 24. Of particular importance to the present invention, the first and second edges 21-22 are formed with U-shaped channels 26 dimensioned to receive the L-shaped flanges 20.

In operation, the cover 14 is slidably connected to the base 12 by positioning the U-shaped channels 26 over the L-shaped flanges 20 and sliding the cover 14 into position. The U-shaped channels 26 and the L-shaped flanges 20 are relatively simple to form and are of minimal cost to the manufacture of the chassis 10. The surface-to-surface contact along the L-shaped flange 20 and U-shaped channel 26 forms an effective barrier to retard the escape of radio frequency (RF) emitted from within the chassis 10.

Referring to FIG. 1a, a more detailed illustration is shown of a contact clip 28 which may be used in conjunction with the flange 20 and the U-shaped channel 26. Contact clip 28 may be placed around the interior of the cover 14 to ensure surface-to-surface contact between the base 12 and cover 14 which are conductors. Each clip 28 comprises a relatively thin strip of an electrically conductive material such as stainless steel which has been "rippled" to provide positive surface-to-surface contact. A screw 30 may be used to secure the clip 28 within the cover 14. The contact clip 28 provides further protection from the release of RF from the chassis 10.

Referring to FIG. 2, a cross-sectional view of a flange/channel connection constructed in accordance with the present invention is shown. The base 12 is formed integrally with the L-shaped flange 20, and the U-shaped channel 26 is formed integrally with the cover 14. In the preferred embodiment, the L-shaped flange 20 is spaced apart from the base 12 by an extension 32, which allows easy installation of the cover 14 without interference from any other surfaces. The U-shaped channel 26 is preferably spaced apart from the first or second edges 21-22 (only second edge 22 shown) by an extension 34. The extension 34 is used to allow the U-shaped channel 26 to be formed to receive the L-shaped flange 20.

Although not shown, it is to be understood that the U-shaped channel could be formed integrally with the base rather than with the cover. Likewise, the L-shaped flange could be formed integrally with the cover 14 to still provide an effective radio frequency barrier.

Although the present invention has been described with respect to a specific preferred embodiment thereof, various changes and modifications may be suggested to one skilled in the art, and it is intended that the present invention encompass such changes and modifications as fall within the scope of the appended claims.

What is claimed is:

1. An improved connection for retarding the transmission of a radio frequency from between a base and a cover for an electronic device, comprising:
    a plurality of L-shaped flanges; and
    a plurality of U-shaped channels for receiving said flanges, said flanges and channels being integrally formed with one of said base and cover, to allow slidable connection of the cover to the base and to retard the escape of radio frequency.

2. The apparatus of claim 1, wherein said L-shaped flange is integral with the base.

3. The apparatus of claim 2, wherein said flanges comprise:
    a first flange on a first edge of the base; and
    a second flange on a second edge of the base.

4. The apparatus of claim 1, wherein said U-shaped channel is integral with the cover.

5. The apparatus of claim 4, wherein said U-shaped channel comprises:
    a first channel on a first edge of the cover; and a second channel on a second edge of the cover.

6. An improved chassis for a personal computer, comprising:
    a base;
    a cover; and
    a plurality of L-shaped flanges and U-shaped channels integral with one of said base and said cover, said flanges and channels operable to be tightly mated to connect and seal said base to said cover to retard the escape of radio frequency from the chassis.

7. The apparatus of claim 6, wherein said base is integral with said L-shaped flanges.

8. The apparatus of claim 7, wherein said L-shaped flanges comprise:
    a first edge of said base; and
    a second edge of said base generally parallel to said first edge.

9. The apparatus of claim 6, wherein said cover is integral with said U-shaped channels.

10. The apparatus of claim 9, wherein said U-shaped channels comprise:
    a first edge of said cover; and
    a second edge of said cover generally parallel to said first edge.

11. The apparatus of claim 6, further including a plurality of metallic clips fixed between said base and said cover to further retard the escape of radio frequency.

12. A method for connecting a cover to a base of a personal computer to retard the transmission of radio frequency, comprising the steps of:
    integrally forming a plurality of L-shaped flanges and a plurality of U-shaped channels with the cover and the base; and
    mating said U-shaped channel with said L-shaped flange to connect the cover to the base and to retard the transmission of radio frequency.

13. The method of claim 12, wherein the step of integrally forming comprises:
    forming a first and second L-shaped flange on opposite and parallel edges of the base; and
    forming a first and second U-shaped channel on opposite and parallel edges of the cover.

14. The method of claim 13, wherein the step of mating comprises sliding the U-shaped channels on the cover onto the L-shaped flanges on the base.

15. A method for forming an improved chassis for a personal computer, comprising the steps of:
    forming a base;
    forming a cover; and
    integrally forming a plurality of L-shaped flanges with said base; and
    integrally forming a plurality of U-shaped channels with said cover to connect and seal said cover to said base to retard the escape of radio frequency from the chassis.

16. The method of claim 15, further including the step of sliding said U-shaped channels onto said L-shaped flanges.

* * * * *